United States Patent
Peng et al.

(10) Patent No.: US 9,632,426 B2
(45) Date of Patent: Apr. 25, 2017

(54) IN-SITU IMMERSION HOOD CLEANING

(75) Inventors: Jui-Chun Peng, Hsin-Chu (TW); Heng-Jen Lee, Baoshan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 898 days.

(21) Appl. No.: 13/008,605

(22) Filed: Jan. 18, 2011

(65) Prior Publication Data

US 2012/0180823 A1    Jul. 19, 2012

(51) Int. Cl.
*B08B 3/00* (2006.01)
*G03F 7/20* (2006.01)
*H01L 21/67* (2006.01)

(52) U.S. Cl.
CPC ...... *G03F 7/70341* (2013.01); *G03F 7/70925* (2013.01); *H01L 21/67057* (2013.01)

(58) Field of Classification Search
CPC .............. G03F 7/2041; G03F 7/70341; G03F 7/70925; G03F 7/70908; G03F 7/70916; B08B 3/048; H01L 21/67051; H01L 21/67057; H01L 21/68714
USPC ........................................... 134/104.1, 104.2
See application file for complete search history.

(56) References Cited

U.S. PATENT DOCUMENTS

| | | | | |
|---|---|---|---|---|
| 5,839,456 | A * | 11/1998 | Han ................. | H01L 21/67051 134/104.1 |
| 5,845,663 | A * | 12/1998 | Han ......................... | B08B 3/10 134/155 |
| 2002/0092547 | A1* | 7/2002 | You ............................ | B08B 3/00 134/36 |
| 2007/0132968 | A1* | 6/2007 | Kobayashi et al. ........... | 355/30 |
| 2007/0221253 | A1* | 9/2007 | Nishikido ................. | B08B 3/02 134/26 |
| 2008/0002164 | A1 | 1/2008 | Chang et al. | |
| 2008/0304025 | A1* | 12/2008 | Chang et al. .................... | 355/30 |
| 2008/0309891 | A1* | 12/2008 | Chang ................. | G03F 7/70341 355/30 |
| 2009/0115979 | A1 | 5/2009 | Van Der Heijden et al. | |
| 2009/0174870 | A1* | 7/2009 | De Jong ............ | G03F 7/70341 355/30 |
| 2009/0251672 | A1* | 10/2009 | Nagasaka et al. .............. | 355/30 |
| 2009/0284715 | A1* | 11/2009 | Watso ................. | G03F 7/70341 355/30 |
| 2011/0199601 | A1* | 8/2011 | Kaneko ............... | G03F 7/70341 355/72 |

FOREIGN PATENT DOCUMENTS

DE    WO 2008089990 A2 *  7/2008  ......... G03F 7/70341

* cited by examiner

Primary Examiner — Michael Kornakov
Assistant Examiner — Marc Lorenzi
(74) Attorney, Agent, or Firm — Slater Matsil, LLP

(57) ABSTRACT

An apparatus includes a wafer stage configured to secure a wafer; and a cleaning module including a tank adjacent to the wafer stage, and is positioned outside the region occupied by the wafer. The cleaning module is configured to receive de-ionized (DI) water into the tank and extract the DI water out of the tank. The tank is configured to hold DI water with a top surface of the DI water substantially level with a top surface of the wafer.

20 Claims, 4 Drawing Sheets

IN-SITU IMMERSION HOOD CLEANING

BACKGROUND

Wafer scanners are used to expose photo resists formed on wafers. The optical performance of a wafer scanner may be improved when a thin water layer is present between the lens of the wafer scanner and the wafer. In the scanning process, water is supplied to, and extracted from, below the lens. Due to high speed scanning movements of the lens, instabilities in the interface between the water and the air that presses on the water occur. This may cause water loss in the form of small droplets at the receding side of the interface.

The water droplets cause the particles of the photo resist, which particles enter into the water when the water is in contact with the photo resist, to be deposited on the receding sides of the immersion hood. Such contamination may cause defects and yield degradation. Therefore, a significant amount of maintenance time is needed to clean the immersion hood.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel immersion hood cleaning module is provided in accordance with an embodiment. The variations and the operation of the embodiment are then discussed. Throughout the various views and illustrative embodiments, like reference numbers are used to designate like elements.

Figure 1:
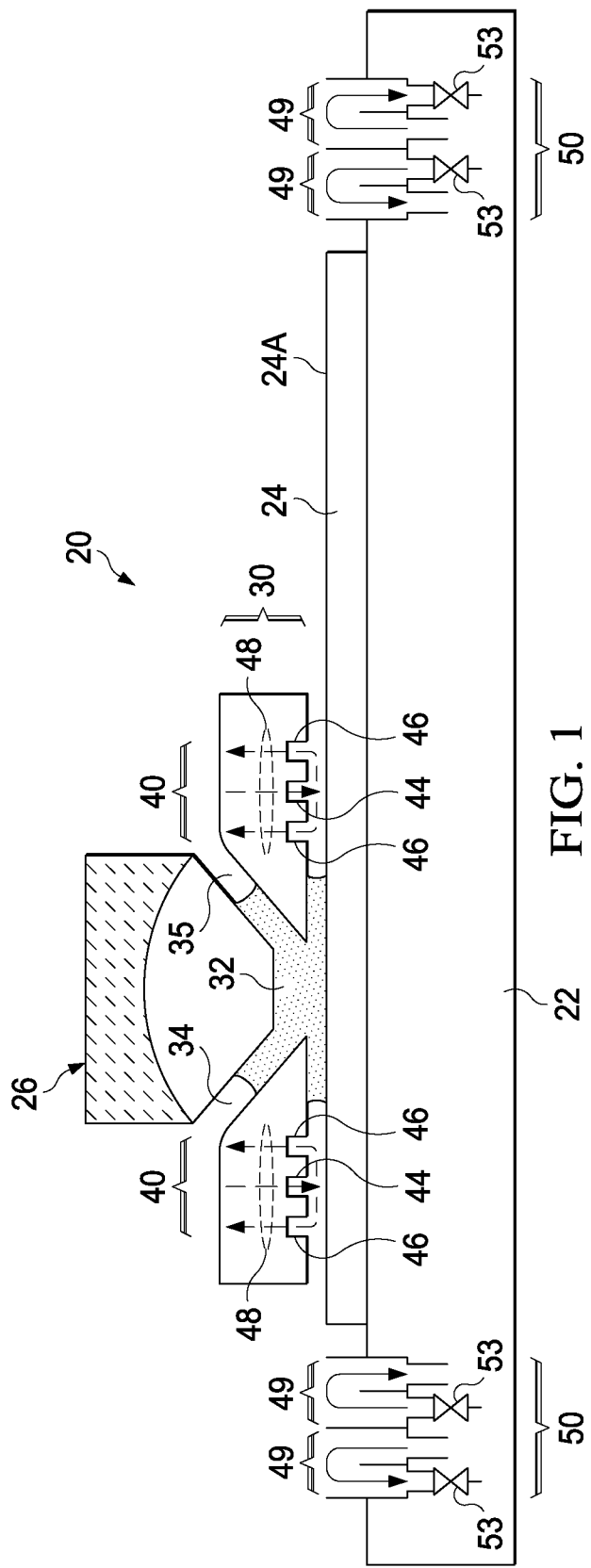
FIG. 1 illustrates a cross-sectional view in the scanning of a wafer using a lens system and an immersion hood.

Referring to FIG. 1, illustrated is a schematic cross-sectional view of immersion lithography system 20. System 20 includes wafer stage 22 for holding and securing wafer 24, which is to be processed by system 20 for exposing a photo resist (not shown) on the surface of wafer 24. Wafer stage 22 may be a vacuum stage, an electro-static stage, or the like. Wafer stage 22 is operable to secure and move wafer 24 up and down. Wafer stage 22 may include various components suitable to perform a precise movement.

Wafer 24, which is to be held by wafer stage 22 and processed by system 20, may be a semiconductor wafer such as a silicon wafer. Semiconductor wafer 24 may include an elementary semiconductor, a compound semiconductor, an alloy semiconductor, or combinations thereof. Semiconductor wafer 24 may include one or more material layers such as poly-silicon, metal, and/or dielectric, to be patterned. In an embodiment, the photo resist (not shown) is formed on the top of wafer 24, and is exposed by system 20.

Immersion lithography system 20 includes one or more imaging lens systems (referred to as a "lens system") 26. During the operation of system 20, wafer 24 may be positioned on wafer stage 22 under lens system 26. Furthermore, during the exposure of the photo resist, wafer 24 may be scanned by lens system 26. Lens system 26 may further include or be integral to an illumination system (e.g., a condenser, not shown), which may have a single lens or multiple lenses and/or other lens components. For example, the illumination system may include micro-lens arrays, shadow masks, and/or other structures.

System 20 includes immersion fluid-retaining module 30 for retaining fluid 32, which is referred to as an immersion fluid hereinafter. Immersion fluid-retaining module 30 may be positioned proximate (such as around) lens system 26 and designed for other functions, in addition to retaining immersion fluid 32. Immersion fluid-retaining module 30 makes up (at least in part) an immersion head or hood, and hence is referred to as immersion hood 30 hereinafter. Immersion fluid 32 may be water such as de-ionized water (DI-water) or a water solution, a high-n fluid (n is index of refraction, the n value at 193 nm wavelength here may be greater than 1.44, for example), or another suitable fluid.

Immersion hood 30 may include various apertures 34 (or nozzles) for providing immersion fluid 32 for an exposure process. Particularly, immersion hood 30 may include aperture 34 as an immersion fluid inlet to provide and transfer immersion fluid 32 into a space (filled with immersion fluid 32 in FIG. 1) between lens system 26 and wafer 24. Immersion hood 30 may also include an aperture 35 as an immersion fluid outlet to remove and transfer immersion fluid 32 away from underlying lens system 26. Immersion fluid 32 may be provided to and extracted from the space at a sufficient rate by components suitable for the scanning of wafer 24.

During the scanning of wafer 24, the bottom of immersion hood 30 is spaced apart from top surface 24A of wafer 24 by a small distance, for example, about 0.1 mm to about 1 mm. To retain immersion fluid 32, air-knifes 40 are formed in immersion hood 30 to retain immersion fluid 32 through an air pressure. In an embodiment, each of air-knifes 40 includes air outlet 44 and air inlets 46, wherein air 48 (symbolized by arrows) is blown out of outlets 44 into the space between wafer 24 and immersion hood 30. Air inlets 46 are used to extract air 48 from the space. The pressure created by air 48 thus retains immersion fluid 32. In an embodiment, in a top view of immersion hood 30, outlets 44 are arranged as a circle (viewed from a top view of FIG. 1) encircling immersion fluid 32, and inlets 46 are also arranged as a circle encircling immersion fluid 32, and possibly encircling the circle formed of outlets 44.

Since immersion fluid 32 is in contact with the top surface of wafer 24, the particles of wafer 24, which particles may be from the photo resist that is to be exposed, may enter into immersion fluid 32. During the high-speeding scanning process, the droplets of immersion fluid 32 are generated, and may adhere to the exposed surface of immersion hood 30 when the droplets evaporate. The particles (not shown) may also adhere to the inner walls of inlets 46. This type of particle adhesion may be most prevalent at the wet/dry interface areas of system 20 and may repeat itself as wafer stage 22 is moved to process the entire wafer 24. Eventually, the particles may become large enough and peel off during processing. The particles may fall off on wafer 24 and thus, may lead to a low yield.

Figure 2A:
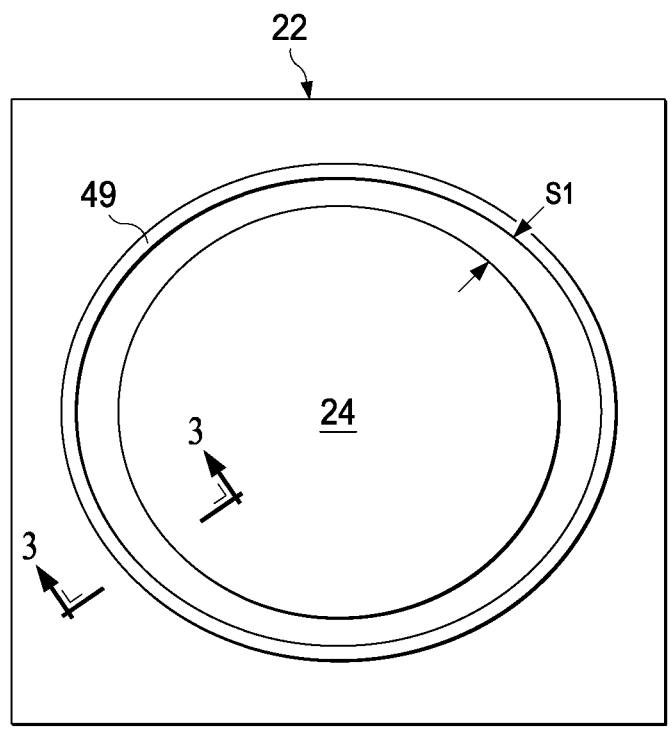
FIGS. 2A through 2C are top views of wafer stages and water tanks of cleaning modules.
Figure 2B:
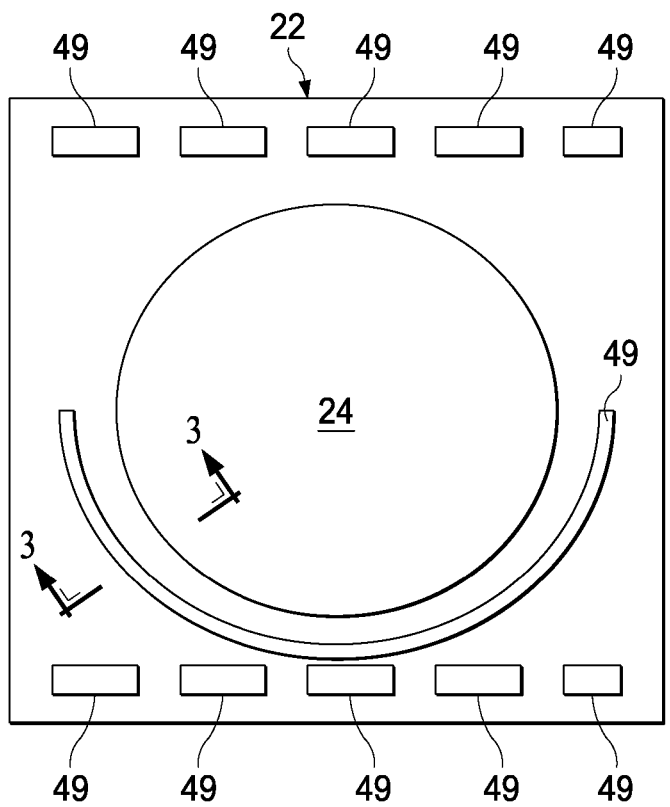
Figure 2C:
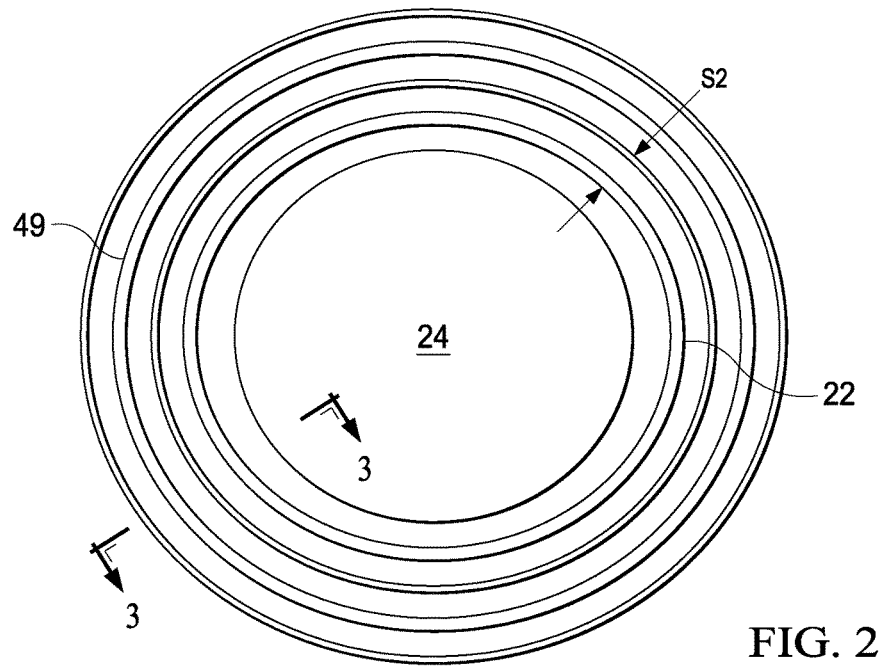

In an embodiment, cleaning module 50 is designed to clean the particles, as also illustrated in FIG. 1. Clean module 50 may include water tanks 49 for retaining water and pumps 53 for providing and/or extracting water. The tops of water tanks 49 are not covered, so that the water in wafer tanks 49 is exposed to open air. FIG. 2A illustrates a top view of FIG. 1. Water tanks 49 are adjacent to wafer 24. The space S1 between water tanks 49 and the respective edge of wafer 24 may be less than about 0.5 mm, or less than about 0.25 mm, for example. In an embodiment, water tanks 49 are formed as a part of wafer stage 22, with water tanks 49 being disposed at least partially in wafer stage 22. As illustrated in FIG. 2A, water tanks 49 may be formed as a ring encircling wafer 24, and encircling the wafer chuck that secures wafer 24. Alternatively, water tanks 49 may have other shapes such as a half circle or a strip(s) (illustrated as dotted lines) as shown in FIG. 2B. In an embodiment, as shown in FIG. 2A, water tanks 49 are designed as a part of stage 22. Alternatively, water tanks 49 may be designed as a separate component not integrated with, but adjacent to, wafer stage 22, as shown in FIG. 2C. Water tanks 49 may be spaced apart from wafer stage 22 by space S2, which may be less than about 65 mm, or less than about 50 mm, for example. It is realized that water tanks 49 may be designed as various shapes as long as it is adjacent to wafer 24/stage 22, and are on the paths of (but below) immersion hood 30 during the scanning operation. As a result, immersion hood 30 may cross above water tanks 49 during the scanning operation.

Figure 3:
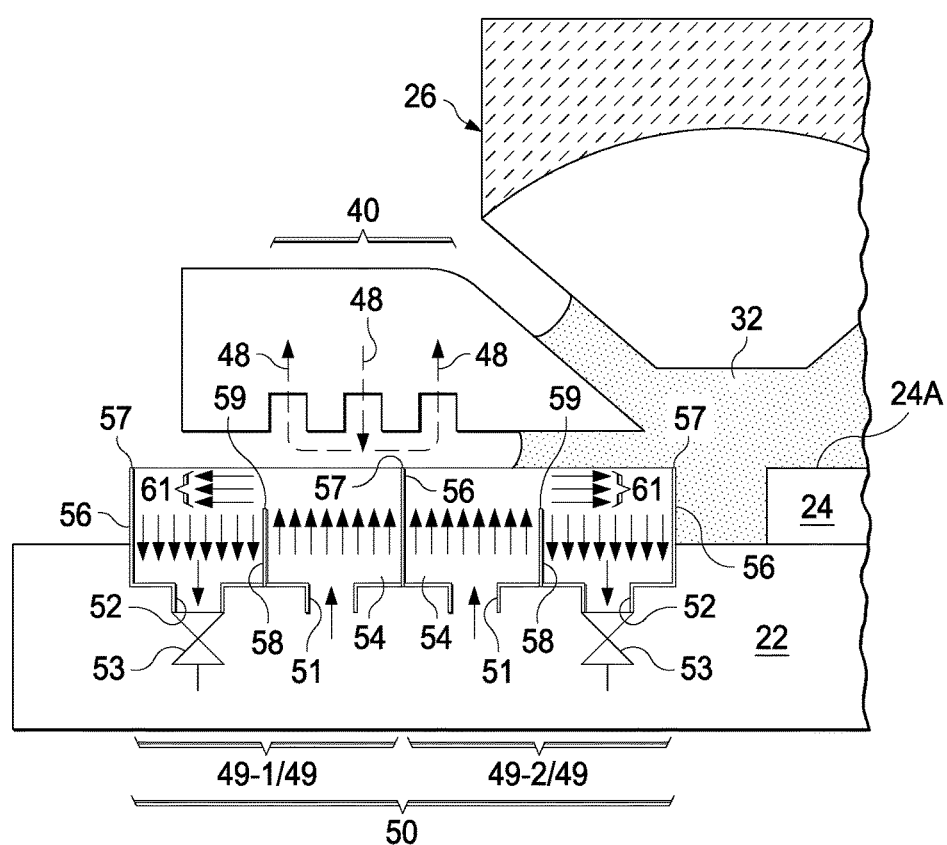
FIG. 3 illustrates the cleaning of the immersion hood using a cleaning module.

FIG. 3 illustrates a cross-sectional view of a portion of cleaning module 50, wherein the cross-sectional view is obtained from the plane crossing lines 3-3 in FIGS. 2A through 2C. In an embodiment, water tanks 49 include inlets 51 and outlets 52. Inlets 51 and outlets 52 may be arranged as a plurality of apertures located at the bottom of water tanks 49, and may be located in stage 22. Accordingly, cleaning module 50 further comprises additional components (not shown), such as pumps 53 and the respective connecting pipes (not shown) built in wafer stage 22. Cleaning module 50 may include inner edges 58 and/or outer edges 56, whose tops 57 are substantially level with the top surface 24A of wafer 24. Further, inner edges 58 inside water tanks 49 may have tops 59 that are lower than tops 57, so that DI-water 54 may enter water tanks 49 from inlets 51, flow over inner tops 59, and be extracted out of water tanks 49 through outlets 52. The top surface of DI-water 54 is exposed to the space directly underlying immersion hood 30, and may be substantially level with top surface 24A of wafer 24.

During the scanning of wafer 24, immersion hood 30 moves to directly over wafer 24, and also moves to directly over water tanks 49. At which time, air 48 is continued to be blown out of outlets 44 and then extracted into inlets 46. Furthermore, immersion fluid 32 is also provided directly under lens system 26 when immersion hood 30 is directly over water tanks 49. When immersion hood 30 is directly over water tanks 49, some of immersion fluid 32 that contains the particles may be replaced by DI-water 54. Accordingly, at least the portions of immersion fluid 32 that are close to air-knife 40 become clean. The resulting droplets, if any, of the cleaner water 54 or immersion fluid 32 thus contain less or substantially no particles. Since there is fewer or substantially no new particles deposited during the cleaning process, the amount of the particles that are carried away by air 48 exceeds the amount of new particles that are deposited, and the net effect is that the particles deposited on immersion hood 30 when immersion hood 30 is directly over wafer 24 is gradually removed. The air flow of air 48 may be adjusted. For example, the force for blowing air 48 out of outlets 44 when immersion hood 30 is directly over water tanks 49 is reduced compared to the force for blowing air 48 out of outlets 44 when immersion hood 30 is directly over wafer 24. The force for extracting air 48 into inlets 46 when immersion hood 30 is directly over water tanks 49 is increased compared to the force for extracting air 48 into inlets 46 when immersion hood 30 is directly over wafer 24.

In an embodiment, cleaning module 50 includes two water tanks 49 for retaining water, wherein the water tanks 49 are also in the form of rings 49-1 and 49-2, with one or a plurality of inlets 51 and one or a plurality of outlets 52 belonging to each of water tanks 49-1 and 49-2. Inlets 51 may be next to each other, while outlets 52 may be on the opposite outer sides of inlets 51. As a result, DI-water 54 flows in opposite directions (shown as arrows 61, which directions are parallel to top surface 24A of wafer 24, and optionally parallel to a radius direction of wafer 24). In alternative embodiments, cleaning module 50 includes only one water tank 49 (either water tank 49-1 or 49-2), so that DI-water 54 flows in only one of the directions 61.

Figure 4:
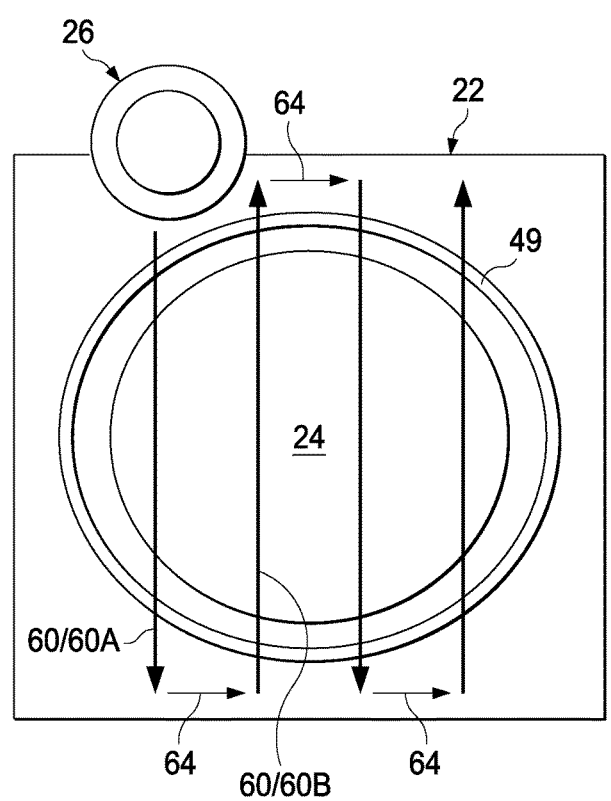
FIG. 4 schematically illustrates a top view of a scanning process.

FIG. 4 schematically illustrates the scanning of wafer 24 and the corresponding cleaning process. Arrows 60 (including 60A and 60B) schematically illustrate the paths of immersion hood 30 and lens system 26 during the scanning process. When immersion hood 30 and lens system 26 move along paths 60 to scan wafer 24, immersion hood 30 may move to directly over wafer 24 and directly over water tanks 49 multiple times. Each time immersion hood 30 crosses water tanks 49, immersion hood 30 is cleaned. The returning points 64 of immersion hood 30 and lens system 26 are on the outer sides of water tanks 49. Therefore, for each of scanning paths 60, immersion hood 30 may be cleaned twice. It is appreciated that the immersion hood cleaning is performed in-situ when wafer 24 is scanned, and no separate maintenance time is needed for the immersion hood cleaning.

In accordance with embodiments, an apparatus includes a wafer stage configured to secure a wafer; and a cleaning module including a tank adjacent to the wafer stage, and is positioned outside the region occupied by the wafer. The cleaning module is configured to receive de-ionized (DI) water into the tank and extract the DI water out of the tank. The tank is configured to hold DI water with a top surface of the DI water substantially level with a top surface of the wafer.

In accordance with other embodiments, an apparatus includes a lens system; a wafer stage positioned under the lens system and configured to secure a wafer; an immersion hood configured to dispose an immersion fluid between the lens system and the wafer; and a cleaning module with at least a part in the wafer stage. The cleaning module includes a water tank encircling the wafer, with the water tank including an inlet and an outlet configured to conduct water.

In accordance with yet other embodiments, a method includes scanning a wafer by moving an immersion hood and a lens system directly over the wafer. During the step of scanning, the immersion hood provides an immersion fluid to a space between the lens system and the wafer. The movement of the immersion hood is continued until the immersion hood moves directly over a cleaning module including a water tank. De-ionized (DI) water flows into and out of the water tank during the step of continuing the movement, wherein a top surface of the DI water is exposed to a bottom of the immersion hood.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
    a wafer stage configured to secure a wafer over a major surface of the wafer stage; and
    a cleaning module comprising a tank adjacent to the wafer stage, the cleaning module positioned outside a region occupied by a wafer when a wafer is secured by the wafer stage, the cleaning module comprising a first portion above the major surface of the wafer stage and a second portion below the major surface of the wafer stage, wherein:
        a top of the tank is disposed in the first portion of the cleaning module, and a bottom of the tank is disposed in the second portion of the cleaning module;
        the tank comprises a first exterior wall, a second exterior wall, and an interior wall, the interior wall disposed between the first exterior wall and the second exterior wall;
        the tank further comprising a first partition and a second partition, the first partition disposed between the first exterior wall and the interior wall, the second partition disposed between the interior wall and the second exterior wall;
        a first upper extent of the first exterior wall and a second upper extent of the second exterior wall and a third upper extent of the interior wall are higher than a fourth upper extent of the first partition and a fifth upper extent of the second partition, the first upper extent and the second upper extent and the third upper extent are coincident with the top of the tank;
        a first lower extent of the first exterior wall and a second lower extent of the second exterior wall and a third lower extent of the interior wall are lower than the fourth upper extent and the fifth upper extent, the first lower extent and the second lower extent and the third lower extent are coincident with the bottom of the tank;
        a first portion of the bottom of the tank between the first exterior wall and the first partition comprising a first fluid outlet, wherein an upper-most opening of the first fluid outlet is disposed in the first portion of the bottom of the tank;
        a second portion of the bottom of the tank between the first partition and the interior wall comprising a first fluid inlet;
        a third portion of the bottom of the tank between the interior wall and the second partition comprising a second fluid inlet;
        a fourth portion of the bottom of the tank between the second partition and the second exterior wall comprising a second fluid outlet, wherein an upper-most opening of the second fluid outlet is disposed in the fourth portion of the bottom of the tank; and
        the tank is configured to hold deionized (DI) water disposed:
            above the first partition and the second partition;
            between the first exterior wall and the interior wall;
            between the second exterior wall and the interior wall; and
            level with a top surface of a wafer when a wafer is secured by the wafer stage.

2. The apparatus of claim 1, wherein the tank forms at least a half circle adjacent the wafer, with a top of the tank exposed.

3. The apparatus of claim 1, wherein the tank is annularly disposed around the wafer, with a top of the tank exposed.

4. The apparatus of claim 1 further comprising an immersion hood and a lens system configured to move over and cross the wafer and the tank.

5. The apparatus of claim 4, wherein the immersion hood further comprises an inlet for disposing an immersion fluid directly under the lens system, and an air-knife configured to retain the immersion fluid directly under the lens system.

6. The apparatus of claim 1, wherein the cleaning module comprises an inlet and an outlet, and the tank comprises a ring.

7. The apparatus of claim 1, wherein the cleaning module and the wafer stage are formed as separate parts.

8. The apparatus of claim 1, wherein:
    a wafer is secured by the wafer stage;
    the cleaning module is positioned outside the region occupied by the wafer; and
    a top surface of DI water is level with a top surface of the wafer.

9. The apparatus of claim 1, wherein the first exterior wall, the second exterior wall, and the interior wall comprise solid material.

10. An apparatus comprising:
    a wafer stage positioned under a lens system, wherein the wafer stage is configured to secure a wafer;
    an immersion hood configured to dispose an immersion fluid between the lens system and a wafer when a wafer is secured on a surface of the wafer stage; and
    a cleaning module positioned outside a region occupied by a wafer when a wafer is secured by the wafer stage, wherein the cleaning module comprises a water vessel adjacent the wafer stage, the water vessel configured to contain water having a top surface of the water being level with a top surface of a wafer when a wafer is secured by the wafer stage, the water vessel comprising:
        a first exterior wall, a second exterior wall, and an interior wall, the interior wall disposed between the first exterior wall and the second exterior wall;
        a first partition and a second partition, the first partition disposed between the first exterior wall and the interior wall, the second partition disposed between the interior wall and the second exterior wall;
        a first upper extent of the first exterior wall and a second upper extent of the second exterior wall and a third upper extent of the interior wall above the surface of the wafer stage;

a first lower extent of the first exterior wall and a second lower extent of the second exterior wall and a third lower extent of the interior wall below the surface of the wafer stage;

the first upper extent and the second upper extent and the third upper extent are coincident with a top of the water vessel;

the first lower extent and the second lower extent and the third lower extent are coincident with a bottom of the water vessel; and a fourth upper extent of the first partition and a fifth upper extent of the second partition are below the top of the water vessel;

a first portion of the bottom of the water vessel between the first exterior wall and the first partition comprising a first fluid outlet;

a second portion of the bottom of the water vessel between the first partition and the interior wall comprising a first fluid inlet;

a third portion of the bottom of the water vessel between the interior wall and the second partition comprising a second fluid inlet; and a fourth portion of the bottom of the water vessel between the second partition and the second exterior wall comprising a second fluid outlet; and a retaining wall portion of the first exterior wall, wherein a top of the retaining wall portion is level with the top surface of the water.

11. The apparatus of claim 10, wherein the wafer stage is configured to secure a wafer on a level top surface, and wherein the retaining wall portion is adjacent to and extends upwards from the level top surface.

12. The apparatus of claim 10, wherein the cleaning module is configured for water to enter the water vessel from the first fluid inlet, flow over the top of the first partition, and be extracted from the water vessel from the first fluid outlet.

13. The apparatus of claim 12, wherein the cleaning module is further configured for water to enter the water vessel from the second fluid inlet, flow over the top of the second partition, and be extracted from the water vessel from the second fluid outlet.

14. The apparatus of claim 10, wherein the water vessel encircles the wafer stage.

15. An apparatus comprising:
a wafer stage configured to secure a wafer;
a cleaning module positioned outside a region occupied by a wafer when a wafer is secured by the wafer stage, wherein the cleaning module comprises a water reservoir adjacent the wafer stage, the water reservoir configured to hold water having a top surface of the water being level with a top surface of the wafer when a wafer is secured on a surface of the wafer stage, wherein the water reservoir extends over a topmost surface of the wafer stage, the water reservoir comprising:
a first exterior wall, a second exterior wall, and an interior wall, the interior wall disposed between the first exterior wall and the second exterior wall;
a first partition and a second partition, the first partition disposed between the first exterior wall and the interior wall, the second partition disposed between the interior wall and the second exterior wall;

a first upper extent of the first exterior wall and a second upper extent of the second exterior wall and a third upper extent of the interior wall above the surface of the wafer stage;

a first lower extent of the first exterior wall and a second lower extent of the second exterior wall and a third lower extent of the interior wall below the surface of the wafer stage;

the first lower extent, the second lower extent, the third lower extent, a fourth lower extent of the first partition, and a fifth lower extent of the second partition are coincident with a bottom of the water reservoir; and a fourth upper extent of the first partition and a fifth upper extent of the second partition are above the bottom of the water reservoir; and wherein the cleaning module comprises:
a first portion of the water reservoir defined by the first exterior wall and the interior wall;
a second portion of the water reservoir defined by the interior wall and the second exterior wall;
a first inlet disposed in the first portion of the water reservoir, the first inlet configured to provide water into the first portion of the water reservoir;
a first outlet disposed in the first portion of the water reservoir at the bottom of the water reservoir, the first outlet configured to extract water from the second portion of the water reservoir;
a second inlet disposed in the second portion of the water reservoir, the second inlet configured to provide water into the second portion of the water reservoir; and
a second outlet disposed in the second portion of the water reservoir at the bottom of the water reservoir, the second outlet configured to extract water from the second portion of the water reservoir.

16. The apparatus of claim 15, further comprising:
a lens system over the wafer stage; and
an immersion hood configured to dispose an immersion fluid between the lens system and a wafer when a wafer is secured by the wafer stage.

17. The apparatus of claim 15, wherein the topmost surface of the wafer stage contacts the first exterior wall.

18. The apparatus of claim 17, wherein the topmost surface of the wafer stage contacts the second exterior wall.

19. The apparatus of claim 15, wherein the cleaning module is configured for water to enter the water reservoir from the first inlet, flow over the first partition, and be extracted from the water reservoir from the first outlet.

20. The apparatus of claim 19, wherein the cleaning module is further configured for water to enter the water reservoir from the second inlet, flow over the second partition, and be extracted from the water reservoir from the second outlet.

* * * * *